United States Patent
Rowell et al.

(10) Patent No.: US 10,707,574 B2
(45) Date of Patent: Jul. 7, 2020

(54) ANTENNA ARRAY, TEST SYSTEM AND METHOD FOR TESTING A DEVICE UNDER TEST

(71) Applicant: Rohde & Schwarz GmbH & Co., KG, Munich (DE)

(72) Inventors: Corbett Rowell, Munich (DE); Hendrik Bartko, Unterhaching (DE); Adam Tankielun, Ottobrunn (DE); Benoit Derat, Munich (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 194 days.

(21) Appl. No.: 15/725,940

(22) Filed: Oct. 5, 2017

(65) Prior Publication Data

US 2018/0102591 A1    Apr. 12, 2018

(30) Foreign Application Priority Data

Oct. 6, 2016   (EP) ..................... 16192538

(51) Int. Cl.
| | | |
|---|---|---|
| *G01R 31/302* | (2006.01) | |
| *H01Q 3/26* | (2006.01) | |
| *G01R 29/10* | (2006.01) | |
| *H01Q 3/01* | (2006.01) | |
| *H01Q 21/06* | (2006.01) | |
| *H04B 17/12* | (2015.01) | |
| *H01Q 3/08* | (2006.01) | |
| *H04B 5/00* | (2006.01) | |

(52) U.S. Cl.
CPC ............ *H01Q 3/267* (2013.01); *G01R 29/10* (2013.01); *G01R 31/3025* (2013.01); *H01Q 3/01* (2013.01); *H01Q 3/08* (2013.01); *H01Q 21/061* (2013.01); *H04B 5/0043* (2013.01); *H04B 17/12* (2015.01)

(58) Field of Classification Search
CPC .. G01R 31/312; G01R 31/307; G01R 31/303; G01R 31/302; G01R 31/2808; G01R 31/2648; G01R 1/07; G01R 1/04
See application file for complete search history.

(56) References Cited

U.S. PATENT DOCUMENTS

| | | | |
|---|---|---|---|
| 5,270,723 | A | 12/1993 | Lopez et al. |
| 6,496,157 | B1 | 12/2002 | Mottier |

(Continued)

FOREIGN PATENT DOCUMENTS

| | | |
|---|---|---|
| CN | 102714805 A | 10/2012 |
| CN | 105742816 A | 7/2016 |
| WO | 2007/142412 A1 | 12/2007 |

OTHER PUBLICATIONS

Extended European Search Report dated Mar. 22, 2017, issued in priority European Application No. 16192538.3, filed Oct. 6, 2016, 7 pages.

*Primary Examiner* — Tung X Nguyen
(74) *Attorney, Agent, or Firm* — Christensen O'Connor Johnson Kindness PLLC

(57) ABSTRACT

An antenna array for at least one of generating and receiving a plane wave in a certain distance is described, the antenna array comprising a plurality of antennas which are movable with respect to each other. The antenna array is configured such that plane waves are at least one of generated and received in the near field of the antenna array. Further, a test system and a method for testing a device under test are described.

18 Claims, 2 Drawing Sheets

(56) References Cited

U.S. PATENT DOCUMENTS

| | | | |
|---|---|---|---|
| 7,522,095 | B1 | 4/2009 | Wasiewicz et al. |
| 8,786,493 | B2 | 7/2014 | Pu et al. |
| 9,344,176 | B2 | 5/2016 | Barker et al. |
| 2003/0034916 | A1 | 2/2003 | Kwon et al. |
| 2004/0104839 | A1* | 6/2004 | Velazquez ............... G01S 19/06 342/357.31 |
| 2010/0045555 | A1 | 2/2010 | Ryou et al. |
| 2014/0256373 | A1 | 9/2014 | Hernandez et al. |
| 2016/0248451 | A1* | 8/2016 | Weissman ............ H04B 1/0064 |

\* cited by examiner

ANTENNA ARRAY, TEST SYSTEM AND METHOD FOR TESTING A DEVICE UNDER TEST

FIELD OF THE DISCLOSURE

Embodiments of the present disclosure relate to an antenna array for generating and/or receiving a plane wave in a certain distance, a test system as well as a method for testing a device under test.

BACKGROUND

An antenna array usually comprises a plurality of individual antennas used to emit electromagnetic waves. The phases of the electromagnetic waves emitted by the individual antennas are adjusted for each antenna such that the whole antenna array is deemed to be one single antenna element emitting an electromagnetic signal having certain characteristics.

The antenna array may be used as a part of a test system in order to test a device under test such as a communication device under far field conditions inside a small test chamber of the test system. If a large distance is provided between the transmitter and the receiver, the emitted electromagnetic wave corresponds to a plane wave. Thus, far field conditions of an antenna element relate to plane waves at the location of the receiver. However, the usage of an antenna array provides the opportunity to simulate far field conditions even though the distance is small since the electromagnetic signal transmitted by the antenna array corresponds to a plane wave at a certain distance. Accordingly, an antenna array is used wherein the antennas of the antenna array are controlled such that they generate electromagnetic waves which together form a plane wave at the location of the device under test, for instance. Thus, it is possible to measure and analyze the receiving and transmission properties of the device under test under far field conditions even though a small distance is provided between the antenna array and the device under test.

Usually, the arrangement of the plurality of antennas within the antenna array is provided such that optimal performances are obtained. Accordingly, the antenna array is suitable for a specific application, in particular a certain distance between the antenna array and the device under test which in turn corresponds to a certain frequency of the plane wave and/or a specific size of the device under test.

However, the user of such a test system, in particular such an antenna array, also wants to test devices which may have different sizes and/or test the same device with different frequencies. Thus, another antenna array has to be installed and calibrated in order to perform these further tests being of interest. This results in a lot of additional effort which in turn increase the costs of the measurements.

SUMMARY

The present disclosure provides examples of an antenna array for generating and/or receiving a plane wave in a certain distance. In some embodiments, the antenna array comprises a plurality of antennas which are movable with respect to each other and wherein the antenna array is configured such that plane waves are generated and/or received in the near field of the antenna array.

Further, the present disclosure provides examples of a test system comprising a device under test and an antenna array as described above. The test system corresponds to an over-the-air measurement system (OTA measurement system). The test system comprises a signal generation/analysis unit which may be part of the overall control unit.

Moreover, the present disclosure provides examples of a method for testing a device under test with an antenna array as described above or a test system as described above.

The present disclosure is based, at least in part, on the finding that the distances and/or spaces between the antennas of the antenna array correspond to the frequency of the plane wave. Since the several antennas can be moved with respect to each other, the frequency of the plane wave can be adjusted such that one and the same antenna array may be used for different frequencies and/or sizes of the device under test. Accordingly, measurements can be performed at different frequencies without changing the antenna array used for the measurements. However, the optimal characteristics can be maintained by adjusting the distances and/or spaces of the antennas with respect to each other resulting in an adaption of the plane wave zone distance of the antenna array. Hence, no further calibrations are necessary as only one antenna array is used in the dedicated test system. Thus, the test system has to be calibrated only once even though several different measurements can be performed. In addition, fewer antennas and transceivers are necessary for the antenna array according to the disclosure with respect to antenna arrays used in the state of the art. Furthermore, the power handling of the antenna array is improved. In addition, the costs of the antenna array are reduced.

In some embodiments, the antennas of the antenna array are displaced in a mechanical manner.

Generally, the antenna array can be deemed at least as a part of a plane wave converter and a near field planar wave generator, respectively.

Another aspect provides an antenna array comprising a plurality of antennas which are located in at least two different layers, wherein the antennas of each layer are of the same kind of antenna and wherein the different layers each comprise different types of antennas. The antenna array is part of an over-the-air measurement system (OTA measurement system). The antennas of the different layers are also spaced from each other in the other directions, for instance by a vertical distance and a horizontal distance when facing the face side of the antenna array. Due to the different layers, the antennas are split in two groups wherein each group comprises a certain type of antennas. The different groups may be located in different planes with respect to the face side of the antenna array. For instance, all the antennas of the first layer are established by waveguide antennas, dipole antennas or patch antennas. According to an embodiment, the first layer only comprises antennas established by waveguide antennas whereas the second layer only comprises antennas established by dipole antennas.

The antenna array may be configured to generate and/or receive a plane wave in a certain distance. The antenna array may be further configured such that plane waves are generated and/or received in the near field of the antenna array.

The antenna array may be provided on a substrate of the printed circuit board type such as silicon or a ceramic, in particular a leaded ceramic chip (LDCC).

According to an aspect, the antenna array is configured such that the plane wave zone distance of the antenna array is adjustable. The plane wave zone distance corresponds to the wavelength of the electromagnetic signals emitted which correlates with the frequency of the electromagnetic signals. Normally, the plane wave zone is the region of an emitter where the emitted signals can be approximated as plane waves. Thus, the plane wave distance is the distance from the emitter to the corresponding point at which the emitted signals can be approximated as plane waves. As the plane wave zone distance can be adjusted due to the moving antennas, different sizes of the device under test can be tested using the same antenna array. Furthermore, multiple frequencies may be used for the measurements since the plane wave zone distance can be shifted appropriately.

According to another aspect, at least one of the movable antennas is movable in two directions, in particular in two of the x-, y-, and z-directions. In general, more variances for the adjustment of the antenna array are provided, for example, the frequency of the plane wave and the plane wave zone distance within the near field of the antenna array, respectively. The more directions can be used for displacement of the antennas, the easier the adjustment of the frequency of the plane waves used for measuring the device under test. Furthermore, the usable frequency range for the measurements is enlarged even though only one antenna array is used.

Further, at least one of the several antennas may be arranged such that the antenna is movable circularly, spirally, helically and/or linearly. The type of movement results in a different adjustment of the whole antenna array since the spaces and/or distances between the antennas are varied according to the specific movement. In some embodiments, coupled movements are possible which means that antennas may be moved circularly in x- and y-direction wherein they are also movable linearly in z-direction. Other coupled movements of the antennas are also possible.

According to another aspect, the antennas are movable in different manner. For instance, some antennas may only be moved linearly whereas other antennas may be moved spirally. In general, different sections of the antenna array may be provided which comprise antennas wherein the antennas of a certain section can only move in a dedicated manner and/or direction, respectively.

Moreover, the several antennas may be movable in groups, in particular in blocks. A block is formed by antennas being arranged directly adjacent to each other wherein a group of antennas may be distributed over the whole antenna array. For instance, an antenna in the upper left and an antenna in the lower right corner may form a group whereas for example three antennas being arranged next to each other in the lower left corner form a block. Moreover, several blocks may form a group. According to a certain embodiment, the several antennas may be displaced linearly in rows or in columns such that each antenna of the group and/or block is displaced in the same way.

According to another aspect, the antenna array has a frame and a surface facing a device under test to be measured wherein the antennas are movable with respect to a reference point on the surface. The antenna array can be used to receive electromagnetic signals emitted by the device under test. Hence, the antennas are positioned such that they receive electromagnetic signals impinging the surface facing the device under test. Alternatively or supplementary, the antenna array emits electromagnetic signals. Thus, the antenna array is configured such that electromagnetic signals are emitted by the surface of the antenna array.

For instance, a control unit is provided which is connected with the antennas such that the antennas are controlled via the control unit. The control unit can be connected with the antennas such that the antennas are moved according to a desired frequency or plane wave zone distance set by a user of the antenna array or the test system. In some embodiments, the control unit automatically adjusts the distances and/or spaces between the antennas such that the desired frequency of the plane wave and/or the desired plane wave zone distance is obtained. The control unit may also have an analysis function for the electromagnetic signals received by the antenna array.

Moreover, a drive unit may be provided which drives the antennas such that the positions of the antennas are adjusted. The drive unit can be connected with the control unit which controls the drive unit such that the antennas are moved. Thus, the control unit controls the drive unit which drives the antennas appropriately. Accordingly, each of the antennas may adopt a certain position resulting in a certain frequency of the electromagnetic signals emitted by the antenna array, in particular in a certain frequency of the plane waves. The plane wave zone distance is shifted accordingly.

In some embodiments, the several antennas are moved such that the plane wave zone distance of the antenna array and/or frequency are/is adjusted. The spaces and/or distances of the antennas with respect to each other influence the frequency of the electromagnetic signals emitted which in turn correlates to the plane wave zone distance of the antenna array.

According to an aspect, plane waves are generated and/or received in the near field of the antenna array. Thus, the antenna array is configured such that the plurality of antennas emit electromagnetic waves which together form a signal corresponding to a plane wave used for constituting far field conditions even though the receiver (i.e. device under test) is positioned in the near field of the transmitter (i.e. antenna array).

In some embodiments, properties of the device under test are measured in the plane wave zone. Receiving and transmission properties of the device under test can be measured under far field conditions even though the device under test is arranged in the near field of the antenna array as already mentioned.

According to another aspect, the distance of the antenna array to the device under test is less than $$d_F = \frac{2D^2}{\lambda}.$$

In the formula, D is the aperture of the device under test and is the wavelength of the electromagnetic signal wherein the wavelength corresponds to the desired frequency. Thus, the distance between the antenna array and the device under test is smaller than the Fraunhofer distance $d_F$ represented by the formula mentioned above. Usually, the formula is used to distinguish the near field and the far field of an antenna element from each other. Accordingly, the device under test is positioned in the near field of the antenna array.

Generally, the antennas may be established by different types of antennas. Thus, a certain group of antennas may be established by waveguide antennas whereas another group of antennas may be established by dipole antennas, for instance.

The different groups can be moved such that they are arranged in different layers. Accordingly, the movable antennas may be driven such that they form two different layers each comprising a certain kind of antenna whereas the layers each have different type of antennas.

The antenna array, in particular the antenna array comprising the different layers, may be used for determining the far field characteristics of a device under test. For this purpose, the signal received is measured by at least two groups of the antennas located in different planes, in particular by the antennas located in the different layers. Optionally, the at least two groups of the antennas are provided by two different antenna types.

According to a first alternative, the amplitude, namely the (voltage) magnitude, of the signal is only measured, in particular by each group of antennas. Then, a so-called "two sphere approach" is used for retrieving the respective phase information. Afterwards, a Fourier transform is applied, namely a near field to far field (NF2FF) transform, to calculate the far field data. Hence, the far field characteristics can be obtained appropriately.

According to a second alternative, the amplitude, namely the (voltage) magnitude, and the phase of the signal are measured, in particular by each group of antennas. Then, additional, particularly pre-determined, phase and/or amplitude contributions are added such that a 3D plane wave converter for hardware Fourier transform is provided. For instance, either analog phase shifters or baseband adaption can be used for adding the phase and/or amplitude contributions.

The at least two groups of the antennas may be moved such that they are located in different planes distanced to each other, but being parallel to the face side of the antenna array.

Further, all antennas of one group, in particular all antennas in a certain layer, may be mixed up/down at a frequency offset in order to determine a phase difference between the respective antennas.

The antennas of one group, in particular the antennas in a certain layer, may have a different frequency response/resonance with respect to the antennas of another group, in particular the antennas of another layer.

In general, the measurement can be performed inside an anechoic chamber (shielded chamber), a shielded box, a shielded room, or in free space.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawing, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
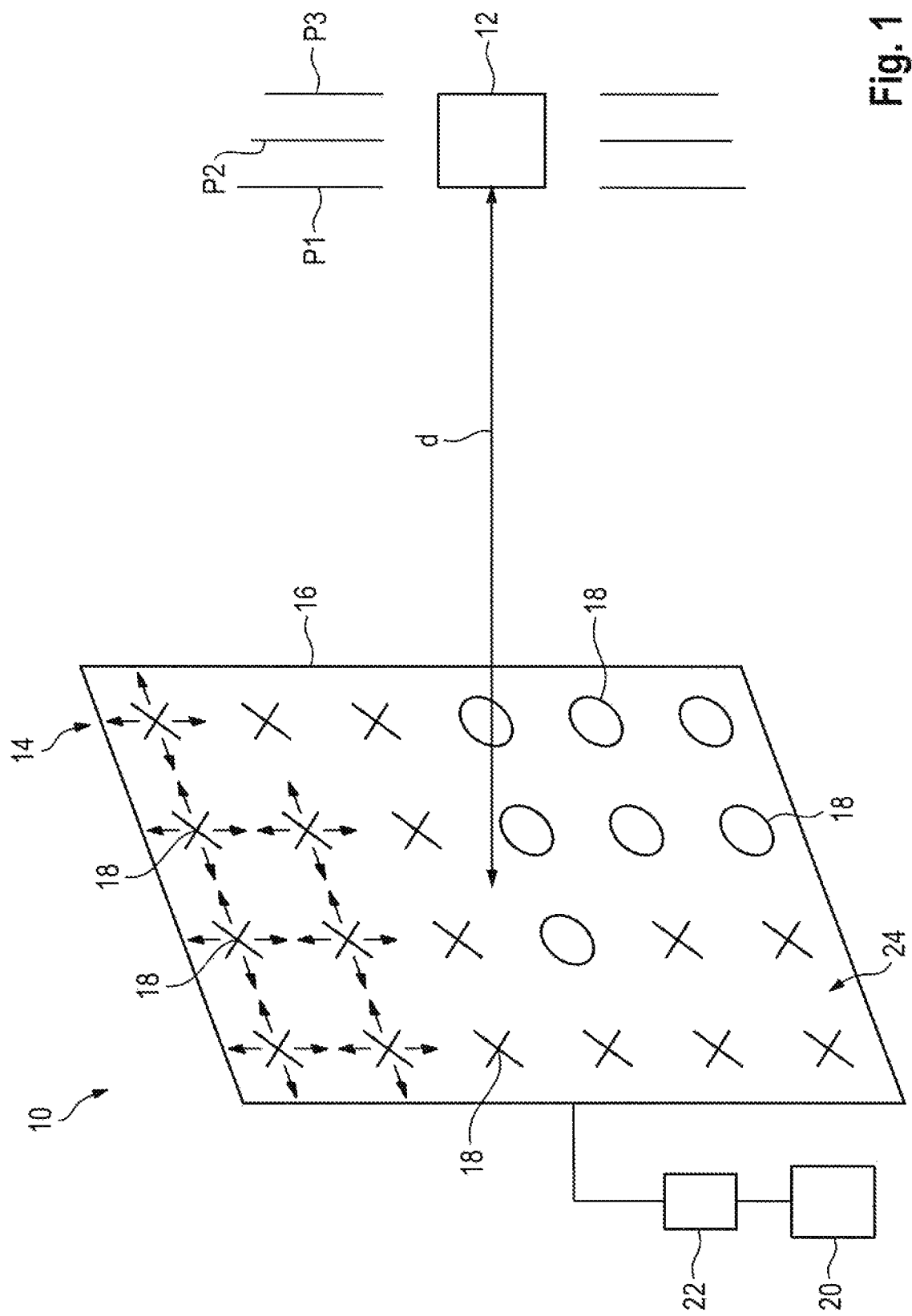
FIG. 1 shows a first embodiment of a test system according to the disclosure.

In FIG. 1, a test system 10 is shown which comprises a device under test 12 (DUT) such as a communication device and an antenna array 14 for generating and/or receiving a plane wave wherein the device under test 12 is positioned at a certain distance d with respect to the antenna array 14.

The antenna array 14 has a frame 16 and a plurality of antennas 18 arranged in the frame 16 wherein the antennas 18 are arranged within the frame 16 such that the antennas 18 are movable with respect to each other as will be described later.

Further, the antenna array 14 comprises a control unit 20 as well as a drive unit 22. The control unit 20 and the drive unit 22 are interconnected with each other such that the drive unit 22 is controlled by the control unit 20. The drive unit 22 is connected to the antennas 18 such that the position of the antennas 18 can be varied by driving signals. Thus, the antennas 18 are driven by the drive unit 22 upon commands received by the control unit 20. Accordingly, the distances and/or the spaces between neighbored antennas 18 can be varied by the drive unit 22.

The frame 16 may comprise a main frame and a plurality of sub frames which correspond to the antennas 18. The sub frames are coupled to the main frame such that they can be moved with respect to the main frame resulting in a movement of the antennas 18 with respect to the main frame.

The frame 16, in particular the main frame, may comprise a slot, channel or notch for each movable antenna 18, in particular the corresponding sub frames, wherein the movable antennas 18 can be moved along the corresponding slots, channels or notches.

Generally, the antenna array 14 may be configured such that electromagnetic waves are emitted via the antennas 18 of the antenna array 14. The plurality of the emitted electromagnetic waves form an electromagnetic signal wherein this electromagnetic signal corresponds to a plane wave at the distance d where the device under test 12 is positioned. The distance d is defined by the distance between the device under test 12 and the antenna array 14, in particular a surface 24 facing the device under test 12. Accordingly, the receiving properties of the device under test 12 under far field conditions can be measured at the position of the device under test 12 since the device under test 12 receives a plane wave being typical for far field conditions.

The corresponding plane wave zone P1 is illustrated in FIG. 1 schematically.

In general, the antenna array 14 is configured such that the plane wave zone is provided in the near field of the antenna array 14. Accordingly, the distance d is smaller than the Fraunhofer distance represented by the formula $$d_F = \frac{2D^2}{\lambda}.$$

Hence, the device under test 12 is positioned in the near field of the antenna array 14 even though it receives plane waves emitted by the antenna array 14 representing far field conditions.

Since the antennas 18 are not fixed to certain positions with respect to the frame 16 of the antenna array 14 resulting in a specific frequency of the plane wave emitted by the antenna array 14, the frequency of the plane wave emitted by the antenna array 14 can be adapted. The frequency of the plane wave correlates with the plane wave zone distance being the distance at which the electromagnetic signal emitted by the antenna array 14 can be approximated by a plane wave used for simulating far field conditions.

Accordingly, dynamic antenna spacing is provided as the spaces and/or distances between the antennas 18 can be changed or altered dynamically.

Accordingly, the antenna array 14 is configured such that its plane wave zone distance and/or the frequency of the emitted plane wave are/is adjustable by displacing the antennas 18 with respect to each other. This is also shown in FIG. 1 since different plane wave zones P2, P3 are provided.

Generally, the antennas 18 can be arranged such that they are movable in two or three directions, in particular the x-, y-, and z-direction. The antennas 18 can be displaced linearly along a predefined path within the frame, for instance. Alternatively or supplementary, the antennas 18 are movable in circular, spiral and/or helical manner.

At least one antenna 18 may be formed as a rotatable circular ring such that circular movement of the antenna 18 is possible.

Generally, the distances and/or spaces may be altered or varied such that periodic changes occur, in particular regarding the rotation angle.

For instance, coupled movements of each antenna 18 are possible which means that, for instance, at least one antenna 18 is moved in a spiral manner regarding the x- and y-plane whereas the same antenna 18 may also move linearly in z-direction. Other coupled movements of the antenna 18 are also suitable.

Moreover, the several antennas 18 can be arranged and driven such that they are moved in different manner. For instance, the antennas 18 arranged in the corner portions of the frame 16 are moved in a different manner (e.g., circular manner) than the ones arranged in the middle of the frame 16 (e.g., linear manner).

Additionally, the antennas 18 can be arranged in groups or blocks wherein all antennas 18 belonging to a group or block are displaced in the same way. Thus, antennas 18 being arranged in a row or a column can be moved linearly. For instance, the antennas 18 of two groups may be moved such that they are located in two different planes being parallel to the surface 24.

For instance, the antennas 18 may perform a translational movement when they are driven by the drive unit 22. Thus, it is ensured that the orientation of the antennas 18 is maintained during the movement. Accordingly, no turning of the antenna with respect to its axis is provided.

All the different movements can be controlled by the control unit 20 which controls the drive unit 22 appropriately such that the drive unit 22 drives the antennas 18 in accordance to the commands received. Due to the different movements of the antennas 18 with respect to each other, the spaces and/or distances of the antennas 18 between each other are adjusted resulting in different frequencies of the plane waves emitted by the antenna array 14.

Alternatively to the above mentioned embodiment, the antenna array 14 can be used to receive electromagnetic signals emitted by the device under test 12. Again, the antennas 18 can be moved in order to vary the plane wave zone distance such that it is ensured that far field conditions are also obtained ensuring that the transmission properties of the device under test 12 can be measured under far field conditions.

Generally, the antenna array 14 can be used to measure the receiving and/or transmission properties of the device under test 12 under far field conditions at different frequencies as the frequency of the plane wave emitted by the antenna array 14 may be varied due to the movable antennas 18. Accordingly, the frequency and/or plane wave zone distance is adjusted among different measurements without the need of interchanging the antenna array. Hence, no further calibration steps are required as only one antenna array 14 is used for all these measurements.

The device under test 12 is measured in the plane wave zone of the antenna array 14 wherein the plane wave zone distance of the antenna array 14 is located within the near field of the antenna array 14. Thus, the device under test 12 is also located within the near field of the antenna array 14 even though it receives plane waves corresponding to far field conditions.

Generally, the antennas 18 may be established by different types of antennas, for instance waveguide antennas, dipole antennas or patch antennas.

In some embodiments, the antennas 18 of one group are formed by the same kind of antenna. For instance, a first group of antennas 18 only comprises waveguide antennas whereas a second group of antennas 18 only comprises patch antennas.

Figure 2:
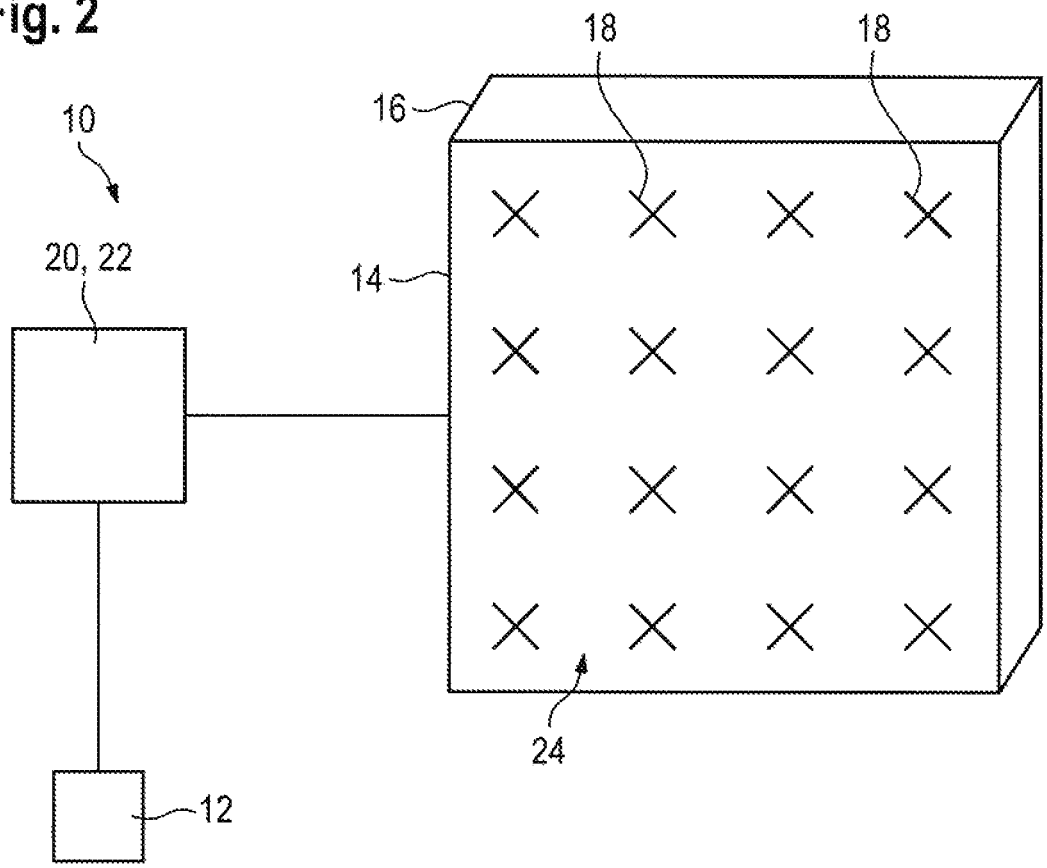
FIG. 2 shows a second embodiment of a test system according to the disclosure.

In FIG. 2, a test system 10 is shown that also comprises a device under test 12 (DUT) such as a communication device and an antenna array 14 for determining the far field characteristics of the device under test 12. Further, a control unit 20 is shown that comprises at least one of a signal generation unit and a signal analyzing unit. The control unit 20 may further have an integrated drive unit 22.

Figure 3:
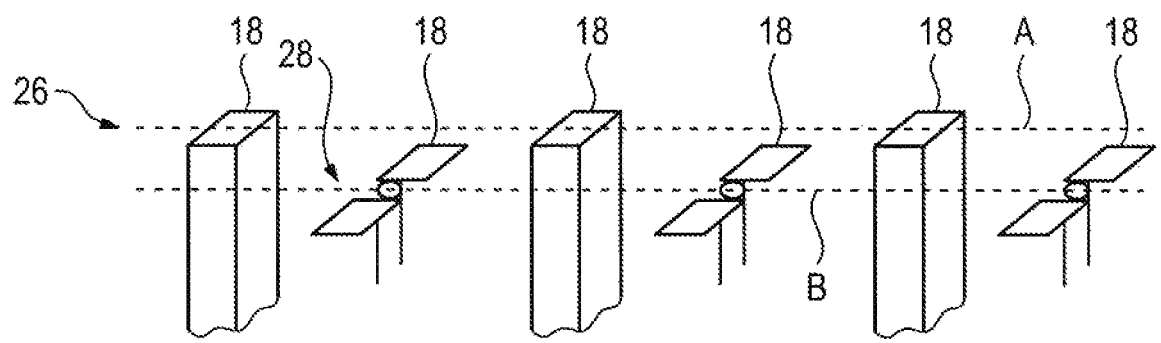
FIG. 3 shows a detail of the antenna array used in the test system shown in FIG. 2.

The antenna array 14 has a frame 16 and a plurality of antennas 18 arranged in the frame 16 wherein the antennas 18 are located in two different layers 26, 28 as shown in FIG. 3. Accordingly, the antennas 18 of the different layers 26, 28 form two different planes A, B being substantially parallel to the surface 24 facing the device under test 12 to be measured. In general, this surface 24 corresponds to the face side of the antenna array 14. Thus, the first layer 26 corresponds to the first plane A whereas the second layer 28 corresponds to the second plane B. The different planes A, B correspond to different (measurement) surfaces such that the antenna array 14 can be used for the so-called "two sphere approach" as will be described later.

The antennas 18 in each layer 26, 28 are formed by the same type of antenna, for example waveguide antennas, dipole antennas or patch antennas. In the shown embodiment, the antennas 18 of the first layer 26 are formed by waveguide antennas whereas the antennas 18 of the second layer 28 are formed by dipole antennas as shown in FIG. 3. Accordingly, the antennas 18 of the different layers 26, 28 are formed by different types of antennas 18 wherein the different types of the antennas 18 are arranged in an alternating manner.

In addition to the different depths due to the layer arrangement, the different types of antennas 18 assigned to the different layers 26, 28 are also spaced from each other in the other directions, namely by a vertical distance and a horizontal distance as shown in FIGS. 2 and 3.

Hereinafter a method for measuring the characteristics of the device under test 12 by using the test system 10 of FIG. 2 is described in more detail. Nevertheless, this method may also apply for the test system 10 shown in FIG. 1.

The antenna array 14 may be used for determining the far field characteristics of the device under test 12.

For this purpose, the signal received is measured by at least two groups of the antennas 18 located in different planes, in particular the antennas 18 are located at the different layers 26, 28. Optionally, the at least two groups of the antennas 18 are provided by two different antenna types wherein all antennas 18 of one group, in particular of one layer 26, 28, are made of the same type of antenna.

According to a first alternative, the amplitude, namely the (voltage) magnitude, of the signal is only measured, in particular by each group of antennas 18, for instance the antennas 18 in the first layer 26. Then, a so-called "two sphere approach" is used for retrieving the respective phase information. This means that the data are obtained by two different (measurement) surfaces which are established by the antennas 18 located in the different layers 26, 28.

Afterwards, a Fourier transform is applied on the data obtained, namely a near field to far field (NF2FF) transform, such that the far field data are calculated in an appropriate manner. Accordingly, the far field characteristics of the device under test 12 have been obtained.

According to a second alternative, the amplitude, namely the (voltage) magnitude, and the phase of the signal are measured, in particular by each group of antennas 18, for instance by each layer 26, 28. Then, additional, particularly pre-determined, phase and/or amplitude contributions are added to the signals processed such that a 3D plane wave converter for hardware Fourier transform is provided. The additional phase and/or amplitude contributions may be provided by using either analog phase shifters or baseband adaption in an appropriate manner. Thus, the far field characteristics of the device under test 12 are also obtained.

As already described above, the at least two groups of antennas 18 may be moved such that they are located in different planes, namely different layers. In these different planes, the antennas 18 are distanced to each other. However, the planes are parallel to each other as well as to the face side of the antenna array 14, namely the surface 24 facing the device under test 14.

Further, all antennas 18 of each group, in particular all antennas 18 in a certain layer 26, 28, may be mixed up/down at a frequency offset in order to determine a phase difference between the respective antennas 18.

The antennas 18 of one group, in particular all antennas 18 in one layer 26, 28, may have a different frequency response/resonance with respect to the antennas 18 of another group, in particular the antennas 18 of another layer 26, 28.

In general, the method for measuring the device under test 12 is performed by using the test system 10. Accordingly, the test system 10 is used to measure the device under test 12 under far field conditions even though the distance d between the antenna array 14 and the device under test 12 is small. The plane wave zone distance is smaller than or equals the distance d between the antenna array 14 and the device under test 12 ensuring that the device under test 12 receives plane waves emitted by the antenna array 14.

In addition, the test system 10 may comprise a chamber, in particular an anechoic chamber, wherein the antenna array 14 as well as the device under test 12 are positioned within this chamber. However, the measurement can be performed inside the anechoic chamber (shielded chamber), a shielded box, a shielded room, or in free space.

In general, the antenna array 14 comprising the different layers 26, 28 and the (fixedly) antennas 18 may be used for the "two sphere approach" or the antenna array 14 having the movable antennas 18 wherein the antennas 18 are moved such that they are located in different layers.

Nevertheless, the antennas 18 located in the different layers 26, 28 may also be configured to be moved in their respective planes A, B as already described with respect to the first embodiment shown in FIG. 1.

Generally, the control unit 20 may comprise a signal generation/analysis component that is configured to generate a signal to be transmitted via the antenna array 14 or to analyze the signal received via the antenna array 14.

The antenna array 14 may be provided may be provided on a printed circuit board type substrate such as silicon or a ceramic, in particular a leaded ceramic chip (LDCC).

In general, the test system 10 is configured such that transmission and/or receiving properties of the device under test 12 can be measured in the plane wave zone of the antenna array 14.

In some embodiments of the present disclosure, the control unit 20 may include, among other components, logic for implementing the technologies and methodologies described herein. This logic of the control unit 20 can be carried out in either hardware or software, or a combination of hardware and software. In some embodiments, the control unit 20 includes one or more computing devices such as a processor (e.g., a microprocessor), a central processing unit (CPU), a digital signal processor (DSP), an application-specific integrated circuit (ASIC), a field-programmable gate array (FPGA), or the like, or any combinations thereof, and can include discrete digital or analog circuit elements or electronics, or combinations thereof.

In an embodiment, the control unit 20 includes a microprocessor and a memory storing logic modules and/or instructions. In an embodiment, the control unit 20 includes one or more ASICs having a plurality of predefined logic components. In an embodiment, the control unit 20 includes one or more FPGA having a plurality of programmable logic components. In an embodiment, the control unit 20 includes hardware circuit implementations (e.g., implementations in analog circuitry, implementations in digital circuitry, and the like, and combinations thereof). In an embodiment, the control unit 20 includes combinations of circuits and computer program products having software or firmware instructions stored on one or more computer readable memories that work together to cause a device, system or unit to perform one or more methodologies or technologies described herein.

It should be noted that for purposes of this disclosure, terminology such as "upper," "lower," "vertical," "horizontal," "inwardly," "outwardly," "inner," "outer," "front," "rear," etc., should be construed as descriptive and not limiting the scope of the claimed subject matter. Further, the use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. The term "about," "approximately," "substantially," "near" etc., means plus or minus 10% of the stated value or condition.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. An antenna array for generating and/or receiving a plane wave in a certain distance, said antenna array comprising a plurality of antennas which are movable with respect to each other, said antenna array being configured such that plane waves are at least one of generated and received in the near field of said antenna array, said antenna array being configured to adapt the plane wave zone distance of said antenna array by adjusting the distances and/or spaces of said antennas with respect to each other.

2. The antenna array according to claim 1, wherein at least one of said movable antennas is movable in two directions.

3. The antenna array according to claim 1, wherein at least one of said movable antennas is movable in x-, y-, and z-direction.

4. The antenna array according to claim 1, wherein at least one of the several antennas is arranged such that said antenna is movable at least one of circularly, spirally, helically and linearly.

5. The antenna array according to claim 1, wherein said antennas are movable in different manner.

6. The antenna array according to claim 1, wherein several antennas are movable in groups.

7. The antenna array according to claim 1, wherein several antennas are movable in blocks.

8. The antenna array according to claim 1, wherein said antenna array has a frame and a surface facing a device under test to be measured, said antennas are movable with respect to a reference point on said surface.

9. The antenna array according to claim 1, wherein a control unit is provided which is connected with said antennas such that said antennas are controlled via said control unit.

10. The antenna array according to claim 1, wherein a drive unit is provided which drives said antennas such that the positions of said antennas are adjusted.

11. The antenna array according to claim 1, wherein said antennas are established by different types of antennas.

12. An antenna array comprising a plurality of antennas which are located in at least two different layers, said antennas of each layer being of the same kind of antenna, said different layers each comprising different types of antennas, said antenna array being configured to adapt the plane wave zone distance of said antenna array by adjusting the distances and/or spaces of said antennas with respect to each other.

13. A test system comprising a device under test and an antenna array according to claim 1.

14. A test system comprising a device under test and an antenna array according to claim 12.

15. A method for testing a device under test, comprising:
using one of an antenna array for testing said device under test, said antenna array selected from the grouped consisting of:
an antenna array comprising a plurality of antennas which are movable with respect to each other, said antenna array being configured such that plane waves are at least one of generated and received in the near field of said antenna array;
an antenna array comprising a plurality of antennas which are located in at least two different layers, said antennas of each layer being of the same kind of antenna, said different layers each comprising different types of antennas; and
adapting the plane wave zone distance of said antenna array by adjusting the distances and/or spaces of said antennas with respect to each other.

16. The method according to claim 15, wherein plane waves are at least one of generated and received in the near field of said antenna array.

17. The method according to claim 15, wherein properties of said device under test are measured in the plane wave zone.

18. The method according to claim 15, wherein the distance of said antenna array to said device under test is less than $$d_F = \frac{2D^2}{\lambda}.$$

* * * * *